United States Patent
Tojima et al.

(10) Patent No.: US 8,406,308 B2
(45) Date of Patent: *Mar. 26, 2013

(54) ENCODING APPARATUS FOR ENCODING BINARY SIGNALS GENERATED FROM BINARIZED MULTIVALUED SYNTAX ELEMENTS AND METHOD FOR PERFORMING THE SAME

(75) Inventors: Masayoshi Tojima, Fukuoka (JP); Masayasu Iguchi, Hyogo (JP); Kiyofumi Abe, Osaka (JP); Hiroaki Toida, Osaka (JP); Takahiro Nishi, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/761,493

(22) Filed: Apr. 16, 2010

(65) Prior Publication Data

US 2010/0232496 A1 Sep. 16, 2010

Related U.S. Application Data

(62) Division of application No. 11/665,063, filed as application No. PCT/JP2005/020496 on Nov. 2, 2005, now Pat. No. 7,724,830.

(30) Foreign Application Priority Data

Nov. 9, 2004 (JP) .................................. 2004-325533

(51) Int. Cl.
*H04N 7/32* (2006.01)
(52) U.S. Cl. ..................................... 375/240.24; 341/57
(58) Field of Classification Search ............. 375/240.24, 375/240.01; 341/56, 57, 107
See application file for complete search history.

(56) References Cited

U.S. PATENT DOCUMENTS

| 5,844,718 | A | * | 12/1998 | Ohsawa et al. | 358/539 |
|---|---|---|---|---|---|
| 6,894,628 | B2 | | 5/2005 | Marpe et al. | |
| 6,927,710 | B2 | * | 8/2005 | Linzer et al. | 341/107 |
| 7,301,485 | B2 | | 11/2007 | Senda | |
| 7,443,318 | B2 | | 10/2008 | Hung et al. | |
| 7,472,151 | B2 | * | 12/2008 | Schumann | 708/322 |
| 7,518,536 | B2 | | 4/2009 | Hung et al. | |
| 7,769,088 | B2 | * | 8/2010 | Prakasam et al. | 375/240.25 |
| 7,778,331 | B2 | * | 8/2010 | Sato et al. | 375/240.26 |

(Continued)

FOREIGN PATENT DOCUMENTS

| JP | 2004-135251 | 4/2004 |
|---|---|---|
| JP | 2004-136261 | 5/2004 |

(Continued)

OTHER PUBLICATIONS

I. Moccagatta et al., "Error-Resilient Coding in JPEG-2000 and MPEG-4," IEEE Journal on Selected Areas in Communications, IEEE Service Center, Piscataway, NJ, US, vol. 18, No. 6, Jun. 2000, pp. 899-914.

(Continued)

*Primary Examiner* — David Harvey
(74) *Attorney, Agent, or Firm* — Wenderoth, Lind & Ponack, L.L.P.

(57) ABSTRACT

An encoding device encoding binary signals using arithmetic-encoding. The encoding device includes a binarization unit binarizing multivalued syntax elements in order to generate the binary signals. The generated binary signals are stored on an intermediate buffer. Further, the encoding device includes an arithmetic-encoding unit performing the arithmetic-encoding on the binary signals stored on the intermediate buffer. Additionally, the generated binary signals are binary representations of values of the multivalued syntax elements.

2 Claims, 12 Drawing Sheets

U.S. PATENT DOCUMENTS

| | | | |
|---|---|---|---|
| 2003/0215018 A1 | 11/2003 | MacInnis et al. | |
| 2003/0219072 A1 | 11/2003 | MacInnis et al. | |
| 2004/0085233 A1 | 5/2004 | Linzer et al. | |
| 2004/0260739 A1* | 12/2004 | Schumann | 708/322 |
| 2005/0062746 A1* | 3/2005 | Kataoka et al. | 345/505 |
| 2005/0201629 A1* | 9/2005 | Karczewicz et al. | 382/240 |

FOREIGN PATENT DOCUMENTS

| | | | |
|---|---|---|---|
| WO | WO 03/092301 | * | 11/2003 |

OTHER PUBLICATIONS

Various Authors, "Advanced video coding for genetic audiovisual services," ITU-T Recommendation H.264—Series H: Audiovisual and Multimedia Systems, Online May 2003, pp. 1-262, Geneva, Switzerland, Retrieved from the Internet: URL:HTTP://mirror.itu.int/dms/pay/itu-t/rec/h/T-REC-H.264-200305-S_PDF-E.pdf> retrieved on Jan. 27, 2006 Section 9.3, pp. 165-221, Section 7.4.1, pp. 47-53, Annex B, pp. 212-214.

"9.3 CABAC parsing process for slice data," DRAFT ITU-T Rec. H.264 (2002 E), pp. 159-196.

Huifang Sun et al., "Digital Video Transcoding for Transmission and Storage," Feb. 2, 2006.

Anthony Vetro et al., "Video Transcoding Architectures and Techniques: An Overview," IEEE Signal Processing Magazine, Mar. 2003, pp. 18-29.

"Transcode"—Wikipedia (Jul. 2, 2008), http://en.wikipedia.org/wiki/Transcoding.

* cited by examiner

| engine | classification of binarized processing |
|---|---|
| referring table method | Look-up Table |
| Fixed Length method | FL(cMax=1, 7, 15) |
| Concatenated Unary/k-th order Exp-Golomb | UEG3(signedValFlag=1, uCoff=9) |
| | UEG0(signedValFlag=0, uCoff=14) |
| Unary method | U |
| Truncated Unary | TU(cMax=2, 3) |

| | usual arithmetic encoding | | | | conversion by stream-converting unit | | |
|---|---|---|---|---|---|---|---|
| synEIVal | prefix | suffix | sign | re-mapping | synEIVal | suffix | sign |
| 0 | 0 | | 0 | | 0 | 0 | 0 |
| 1 | 10 | | 0 | | 1 | 100 | 0 |
| -1 | 10 | | 1 | | -1 | 100 | 1 |
| 2 | 110 | | 0 | | 2 | 101 | 0 |
| -2 | 110 | | 1 | | -2 | 101 | 1 |
| 3 | 1110 | | 0 | | 3 | 11000 | 0 |
| -3 | 1110 | | 1 | | -3 | 11000 | 1 |
| 4 | 11110 | | 0 | | 4 | 11001 | 0 |
| -4 | 11110 | | 1 | | -4 | 11001 | 1 |
| 5 | 111110 | | 0 | | 5 | 11010 | 0 |
| -5 | 111110 | | 1 | | -5 | 11010 | 1 |
| 6 | 1111110 | | 0 | | 6 | 11011 | 0 |
| -6 | 1111110 | | 1 | | -6 | 11011 | 1 |
| 7 | 11111110 | | 0 | | 7 | 1110000 | 0 |
| -7 | 11111110 | | 1 | | -7 | 1110000 | 1 |
| 8 | 111111110 | | 0 | | 8 | 1110001 | 0 |
| -8 | 111111110 | | 1 | | -8 | 1110001 | 1 |
| 9 | 1111111111 | 0000 | 0 | re-mapping by adding 1 bit of "0" to suffix and 4 bits of "1111" to prefix of suffix | 9 | 111100000 | 0 |
| -9 | 1111111111 | 0000 | 1 | | -9 | 111100000 | 1 |
| 10 | 1111111111 | 0001 | 0 | | 10 | 111100001 | 0 |
| -10 | 1111111111 | 0001 | 1 | | -10 | 111100001 | 1 |
| 15 | 1111111111 | 0110 | 0 | | 15 | 111100110 | 0 |
| -15 | 1111111111 | 0110 | 1 | | -15 | 111100110 | 1 |
| 16 | 1111111111 | 0111 | 0 | | 16 | 111100111 | 0 |
| -16 | 1111111111 | 0111 | 1 | | -16 | 111100111 | 1 |
| 17 | 1111111111 | 100000 | 0 | | 17 | 11111000000 | 0 |
| -17 | 1111111111 | 100000 | 1 | | -17 | 11111000000 | 1 |
| 18 | 1111111111 | 100001 | 0 | | 18 | 11111000001 | 0 |
| -18 | 1111111111 | 100001 | 1 | | -18 | 11111000001 | 1 |
| 19 | 1111111111 | 100010 | 0 | | 19 | 11111000010 | 0 |
| -19 | 1111111111 | 100010 | 1 | | -19 | 11111000010 | 1 |
| 30 | 1111111111 | 101101 | 0 | | 30 | 11111001101 | 0 |
| -30 | 1111111111 | 101101 | 1 | | -30 | 11111001101 | 1 |
| 31 | 1111111111 | 101110 | 0 | | 31 | 11111001110 | 0 |
| -31 | 1111111111 | 101110 | 1 | | -31 | 11111001110 | 1 |
| 32 | 1111111111 | 101111 | 0 | | 32 | 11111001111 | 0 |
| -32 | 1111111111 | 101111 | 1 | | -32 | 11111001111 | 1 |
| 8191 | 1111111111 | 1111...11110 | 0 | | 8191 | 1111111111...11111110 | 0 |
| -8191 | 1111111111 | 1111...11110 | 1 | | -8191 | 1111111111...11111110 | 1 |
| 16383 | 1111111111 | 1111...11111 | 0 | | 16383 | 1111111111...11111111 | 0 |
| -16384 | 1111111111 | 1111...11111 | 1 | | -16384 | 1111111111...11111111 | 1 |

ENCODING APPARATUS FOR ENCODING BINARY SIGNALS GENERATED FROM BINARIZED MULTIVALUED SYNTAX ELEMENTS AND METHOD FOR PERFORMING THE SAME

This application is a Divisional of U.S. application Ser. No. 11/665,063, filed Apr. 11, 2007 now U.S. Pat. No. 7,724,830, which is a national stage application of International Application No. PCT/JP2005/020496, filed Nov. 2, 2005.

BACKGROUND OF THE INVENTION

1. Field of Invention

The present invention relates to the decoding processing of bitstreams encoded in accordance with an arithmetic-encoding system in image compression such as ITU-T Rec. H.264|ISO/EC 14496-10 AVC by JVT.)

2. Description of the Related Art

In recent image data compression, standards such as International Standard of Joint Video Specification (ITU-T Rec. H.264|ISO/IEC 14496-10 AVC) by Joint Video Team (JVT) of ISO/IEC MPEG & ITU-T VCEG are being set up to provide higher compression. The standard is often called H.264/MPEG4-AVC in short. In the following description, the standard is simply referred to as H.264.

In the H.264 standard, an arithmetic-encoding system is used to encode bitstreams. Arithmetic encoding converts multivalued signals into binary signals. Therefore, the binary signals are converted into the multivalued signals to decode the bitstreams. At this time, a Context-based Adaptive Binary Arithmetic Coding system (hereinafter called a "CABAC") is used in the conversion.

In the CABAC, there is provided a context-calculating unit operable to calculate the probability of symbols, and arithmetic-decoding calculation is performed based on the calculated probability from the context-calculating unit. In bitstreams having experienced the arithmetic-decoding calculation, the binary signals are converted into the multivalued signals.

At this time, the arithmetic-decoding calculation and context calculation are designed to treat incoming bitstreams serially, and the ultimately multivalued data is generated in dependence upon processing speeds of the arithmetic-decoding calculation.

Cited Reference No. 1 (published Japanese Patent Application Laid-Open No. 2004-136261) discloses the decoding of bitstreams in accordance with the arithmetic-decoding system. According to arithmetic decoding as taught by the cited Reference No. 1, when a bit amount of each of incoming bitstreams is greater than a processing amount of the arithmetic decoding, then the bitstreams are treated as an error.

Another cited Reference No. 2 (US2004/0085233A1) discloses an art operable to divide decoding processing into two stages using a memory. According to the cited Reference No. 2, the memory temporarily stores incoming bitstreams. A transcoder unit reads the bitstreams out of the memory to decode and then encode the bitstreams, and transfers the encoded bitstreams back into the memory. The bitstreams taken out of the memory are re-decoded to display images.

However, according to the decoding-processing unit as disclosed by the cited Reference No. 1, both of the arithmetic-decoding calculation and the context calculation can treat the bitstreams only serially. Meanwhile, the multivalued conversion is followed by image display based on the decoded data. At this time, images must be displayed in real time, and required data amounts must be decoded within a predetermined period of time.

For example, for a high-vision (hereinafter called a "ED-TV") image, data consisting of 1920 pixels-by-1088 lines must be decoded at the speed of 1/30 seconds, i.e., 33.3 msec. It follows that time required to decode a micro block (hereinafter called a "MB") is 33.3/8160 or approximately 4085 nsec.

As specified by the H.264 standard, the maximum bit amount for a MB has the value of 3200-bit. According to the maximum bit amount, one-bit must be decoded at the speed of 4085/3200 or approximately 1.27 nsec to decode a HD-TV image. The speed corresponds to a clock frequency of some 784 MHz.

Such high clock signals as high as 784 MWH have a problem of severe difficulties in designing the decoding-processing apparatus.

According to the cited Reference No. 1, data that remain to be decoded because of a delay in decoding processing are handled as errors. However, an increase in amount of data treated as errors brings about another problem in that proportionally non-uniform and disturbed images are reproduced.

According to the cited Reference No. 2, the memory compensates a difference between data-processing speed required for image reproduction and data-processing speed in the arithmetic decoding. However, the cited Reference No. 2 fails to show a specific construction operable to synchronize the bitstreams between the transcoder unit and a decoding unit at a last stage. This causes problems that a failure in processing of the bitstreams, errors in decoding, and so on are likely to occur when the memory absorbs the difference in processing speed. Furthermore, the fact that the data at first decoded is re-encoded to decode the re-encoded data involves yet further problems of complex processing, prolonged time lapse between the entry of the bitstreams and the ultimate display of images, and consequential poorness in usability.

In view of the above, the present invention provides a decoding-processing apparatus and method operable to perform both arithmetic decoding calculation and multivalued calculation at clock speeds that facilitate the design of the decoding-processing apparatus, while displaying images in real time.

BRIEF SUMMARY OF THE INVENTION

A first aspect of the present invention provides a decoding-processing apparatus comprising: a context-calculating unit operable to calculate the probability of a symbol contained in an incoming bitstream; a parameter-generating unit operable to generate a parameter for use in the context-calculating unit; an arithmetic decoding-calculating unit operable to decode the incoming bitstream in accordance with the probability, thereby providing decoded data; a stream-converting unit operable to convert the decoded data into an intermediate bitstream; a storage unit operable to store the intermediate bitstream; a synchronization-detecting unit operable to detect calculation start timing from the intermediate bitstream fed out of the storage unit, thereby providing detected calculation start timing; and a multivalued calculating unit operable to permit the intermediate bitstream fed out of the storage unit to be multivalued in synchronism with the detected calculation start timing from the synchronization-detecting unit.

The above structure realizes both arithmetic decoding calculation and multivalued calculation at clock speeds that facilitate the design of the decoding-processing apparatus, while displaying images in real time.

A second aspect of the present invention provides a decoding-processing apparatus in which the parameter-generating unit differs from the multivalued calculating unit in terms of processing bit amount per unit time.

The above structure satisfies time constraints on arithmetic decoding, which must be made per one bit, and multivalued calculation that must satisfy real-time image display.

A third aspect of the present invention provides a decoding-processing apparatus in which the storage unit comprises a buffer operable to temporarily store the incoming bitstream.

The above structure achieves the effective use of memory resources.

A fourth aspect of the present invention provides a decoding-processing unit in which the stream-converting unit inserts a synchronous word into the decoded data.

The above structure allows for easy detection of synchronization from the intermediate bitstreams.

A fifth aspect of the present invention provides a decoding-processing apparatus in which the stream-converting unit inserts an error identifier into the intermediate bitstream when the intermediate bitstream is incorrectly multivalued, or when a synchronous word in the intermediate bitstream is detected during multivalued calculation, or when one bit string other than another specified as a synchronous word is detected at a position of the synchronous word in the intermediate bitstream.

The above structure prevents undue processing during the multivalued calculation.

A sixth aspect of the present invention provides a decoding-processing apparatus in which the stream-converting unit performs byte alignment processing to generate the intermediate bitstream.

The above structure detects synchronous words at accurate start positions.

A seventh aspect of the present invention provides a decoding-processing apparatus in which the stream-converting unit inserts an emulation prevention byte into the intermediate bitstream.

The above structure detects synchronization with improved accuracy.

An eighth aspect of the present invention provides a decoding-processing apparatus in which the stream-converting unit generates the intermediate bitstream in such a manner that a bit length of the intermediate bitstream for each syntax element contained in the intermediate bitstream and generated by the multivalued calculating unit is smaller in length than a bit length of the incoming bitstream for each syntax element contained in the incoming bitstream.

The above structure allows the multivalued calculation to be made with reduced loads.

A ninth aspect of the present invention provides a decoding-processing apparatus in which the stream-converting unit converts the incoming bitstream directly into the intermediate bitstream when the incoming bitstream is a non-compressed code.

The above structure allows for easy multivalued calculation.

A tenth aspect of the present invention provides a decoding-processing apparatus in which the stream-converting unit generates the intermediate bitstream in accordance with algorithm of entropy encoding other than the arithmetic encoding.

The above structure generates intermediate bitstreams suited for the entropy decoding.

An eleventh aspect of the present invention provides a decoding-processing apparatus in which, using software, the arithmetic decoding-calculating unit decodes, for each syntax element, at least one of "mb_skip_flag", "mb_field_flag", and "end_of_slice_flag" among the syntax elements included in the H.264 standard, but the arithmetic decoding-calculating unit continuously decodes, without using the software, syntax elements from "mb_type" to "coeff_abs_level_minus1" among the syntax elements included in the H.264 standard.

The above structure performs arithmetic calculation at improved processing speeds. In addition, the above structure provides a reduced difference between the arithmetic calculation and the multivalued calculation, and consequently provides a storage unit having smaller capacity.

A twelfth aspect of the present invention provides a decoding-processing apparatus in which the synchronization-detecting unit detects the synchronous word from the intermediate bitstream, thereby detecting the calculation start timing.

The above structure assuredly detects the calculation start timing in the multivalued calculation.

A thirteenth aspect of the present invention provides a decoding-processing apparatus in which the multivalued calculating unit multivalues the intermediate bitstream, thereby generating a syntax element.

A fourteenth aspect of the present invention provides a decoding-processing apparatus, further comprising: a determining unit operable to determine a method in which the incoming bitstream has been encoded; and an entropy-decoding unit operable to multivalue the intermediate bitstream fed out of the storage unit, in which the intermediate bitstream fed out of the storage unit is multivalued by the multivalued calculating unit when the determining unit determines that the incoming bitstream has been encoded in accordance with arithmetic encoding, but the intermediate bitstream fed out of the storage unit is decoded by the entropy-decoding unit when the determining unit determines that the incoming bitstream has been encoded in accordance with entropy encoding other than the arithmetic encoding.

The above structures reduce undue loads on calculation during the multivalued calculation, thereby realizing high-speed multivalued calculation.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 7 is an illustration showing a list of encoding of syntax elements according to the second embodiment;

FIG. 8 is an illustration showing another list of encoding of syntax elements according to prior art;

DETAILED DESCRIPTION OF THE INVENTION

Embodiments of the present invention are now described with reference to the accompanying drawings.

First Embodiment

Figure 1:
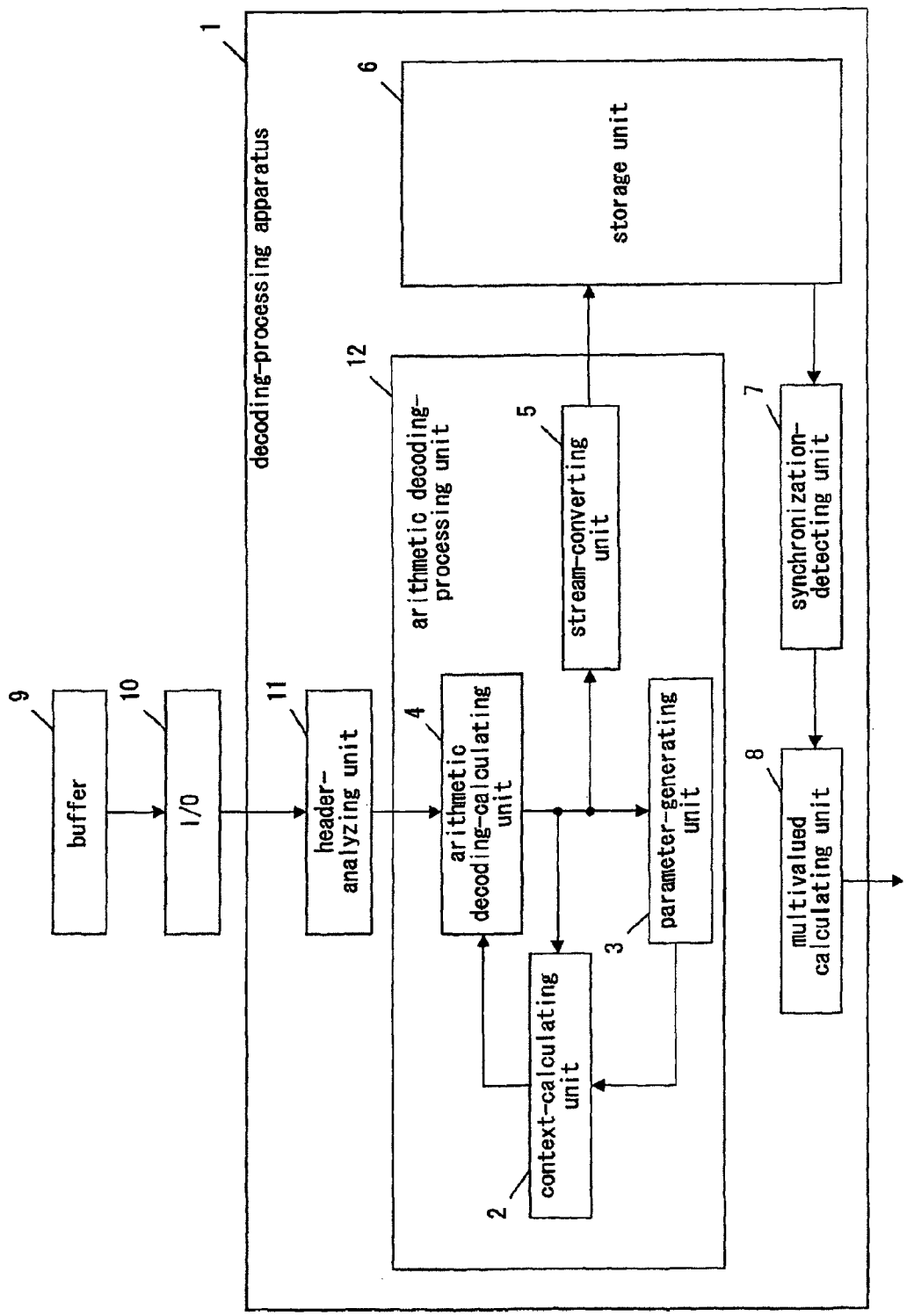
FIG. 1 is a block diagram illustrating a decoding-processing apparatus according to a first embodiment of the present invention.

FIG. 1 is a block diagram illustrating a decoding-processing apparatus according to a first embodiment of the present invention.

The decoding-processing apparatus 1 comprises elements as given below.

A context-calculating unit 2 is operable to calculate the probability of symbols contained in incoming bitstreams. A parameter-generating unit 3 is operable to generate parameters for use in the calculation made by the context calculating unit 2.

An arithmetic decoding-calculating unit 4 is operable to decode the incoming bitstreams in accordance with an arithmetic-decoding system on the basis of the calculated probability from the context-calculating unit 2, thereby providing decoded data. A stream-converting unit 5 is operable to generate intermediate bitstreams on the basis of the decoded data. An arithmetic decoding-processing unit 12 includes the context-calculating unit 2, the parameter generating unit 3, the arithmetic decoding-calculating unit 4 and the stream-converting unit 5. A storage unit 6 is operable to store the generated intermediate bitstreams from the stream-converting unit 5. A synchronization-detecting unit 7 is operable to detect calculation start timing from the intermediate bitstreams fed out of the storage unit 6. A multivalued calculating unit 8 is operable to multivalue the intermediate bitstreams in synchronism with the detected calculation start timing from the synchronization-detecting unit 7. The multivalued intermediate bitstreams are used to reproduce images.

A header-analyzing unit 11 may optionally be provided. The header-analyzing unit 11 is operable to analyze information contained in the entered incoming bitstreams at a header of each of the incoming bitstreams. For example, each of the headers contains information such as an incoming bitstream-encoding system, an image size, and encoding options in use. The header-analyzing unit 11 analyzes these pieces of information contained in each of the headers. The incoming bitstreams may optionally be stored temporarily in a buffer 9 before being fed into the decoding-processing apparatus 1. The incoming bitstreams enter the decoding-processing apparatus 1 through an I/O 10.

The following discusses details of each of the elements and behaviors thereof.

The buffer 9 temporarily stores the incoming bitstreams. The buffer 9 may optionally be used in conjunction with the storage unit 6 as detailed later.

The I/O 10 is an interface, through which the incoming bitstreams are transferred from the buffer 9 into the decoding-processing apparatus 1. The incoming bitstreams are transferred into the header-analyzing unit 11.

The header-analyzing unit 11 analyzes the header information on each of the incoming bitstreams. The header information includes incoming bitstream-related start codes and slice-headers, and so on, all of which are analyzed by the header-analyzing unit 11.

The following discusses the context-calculating unit 2.

The context-calculating unit 2 calculates the probability of symbols contained in the incoming bitstreams. The context-calculating unit 2 calculates the probability of binary signals to be decoded from the incoming bitstreams, on the basis of situations of the circumstances, i.e., on the basis of contiguous bit signals across each target bit signal to be decoded. The probability must be renewed for each one-bit signal having binary information, and the context-calculating unit 2 must process the incoming bitstreams serially per one-bit.

Furthermore, the context-calculating unit 2 calculates the probability using the generated parameters from the parameter-generating unit 3.

The calculated probability is fed out of the context-calculating unit 2 into the arithmetic decoding-calculating unit 4.

The following discusses the parameter-generating unit 3.

The parameter-generating unit 3 generates the parameters to be used by the context-calculating unit 2, and feeds the generated parameters into the context-calculating unit 2. The parameter-generating unit 3 multivalues the decoded data or binary signals, and generates the parameters during the multivalued processing. As is the case with the context-calculating unit 2, the decoded data must be treated serially per one-bit.

The following discusses the arithmetic decoding-calculating unit 4.

The arithmetic decoding calculating unit 4 decodes, in accordance with the probability, the incoming bitstreams that have been encoded in accordance with the arithmetic-encoding system. The incoming bitstreams encoded in accordance with the arithmetic-encoding system are binary data encoded in accordance with the probability. Since the incoming bitstreams have been encoded in accordance with the arithmetic-encoding system, the incoming bitstreams differ in array and value from bitstreams directly used for image reproduction. Accordingly, arithmetic decoding inverse to arithmetic encoding allows the bitstreams directly used for the image reproduction to be decoded as decoded data. Similarly to the incoming bitstreams, the decoded data is binary data as well.

The arithmetic decoding calculating unit 4 feeds the decoded data thus decoded into the context-calculating unit 2, parameter-generating unit 3, and stream-converting unit 5. The arithmetic decoding-calculating unit 4 decodes the incoming bitstreams in accordance with the probability that is imparted to each piece of one-bit data, and the incoming bitstreams are processed serially per one-bit.

At least one of "mb_skip_flag", "mb_field_flag", and "end_of_slice_flag" among syntax elements included in the H.264 standard is decoded, for each of the syntax elements, by the arithmetic decoding-calculating unit 4, using particular software. Syntax elements from "mb_type" to "coeff_abs_level_minus1" among the syntax elements included in the 11.264 standard are continuously decoded by the arithmetic decoding-calculating unit 4 without the use of the particular software. The processing as just discussed provides high-speed arithmetic decoding.

The following discusses the stream-converting unit 5.

The stream-converting unit 5 converts, back into bitstreams, the decoded data as decoded by the arithmetic decoding-calculating unit 4. The decoded data is generated by the incoming bitstreams being decoded, and is free of synchronous words and header flags. During multivalued calculation, the multivalued calculating unit 8 as discussed later utilizes, as start timing, an image data separation contained in each of the bitstreams. The decoded data before being converted into the bitstreams is free of the image data separations; the decoded data is at first transferred to the multivalued calculating unit 8 through the storage unit 6, and consequently the multivalued calculating unit 8 cannot detect the calculation start timing of the multivalued calculation.

In particular, the calculation start timing is essential for high-speed processing carried out by the multivalued calculating unit 8.

The stream-converting unit 5 inserts, into the decoded data, the synchronous words and header required by the multivalued calculating unit 8, thereby changing the decoded data at first arithmetically decoded to pseudo bitstreams. More specifically, the stream-converting unit 5 converts the decoded data as arithmetically decoded, into intermediate bitstreams. As a result, the intermediate bitstreams have the synchronous words and header contained in the decoded data as arithmetically decoded, for use in detecting the calculation start timing. The fact that the decode data is converted into the intermediate bitstreams by the stream-converting unit 5 allows the multivalued calculating unit 8 to perform the multivalued calculation of a mass of bit in parallel in one-cycle. As a result, for images that must be reproduced in real time, the multivalued calculation is executed at clock speeds that facilitate the design of the decoding-processing apparatus, as discussed later. In addition, when images are reproduced, the occurrence of errors due to a delay in multivalued calculation is eliminated.

The following discusses the storage unit 6.

The storage unit 6 stores the generated intermediate bitstreams from the stream-converting unit 5. The intermediate bitstreams stored in the storage unit 6 are moved, through the synchronization-detecting unit 7, to the multivalued calculating unit 8, in which the intermediate bitstreams experience the multivalued calculation. The intermediate bitstreams generated by the stream-converting unit 5 are temporarily stored in the storage unit 6; the temporarily stored intermediate bitstreams are then fed out of the storage unit 6 into the multivalued calculating unit 8 when a certain amount of the intermediate bitstreams are collected in the storage unit 6.

The stream-converting unit 5 is similar in processing speed to the arithmetic decoding-calculating unit 4, and must process the decode data serially per one-bit. The serially processed data is gradually accumulated in the storage unit 6. Meanwhile, the multivalued calculating unit 8 operable to calculate a mass of data in one-cycle can take the intermediate bitstreams out of the storage unit 6 for each certain amount of the accumulated intermediate bitstreams. More specifically, the storage unit 6 acts as a buffer, and absorbs a difference in processing speed between the arithmetic decoding-calculating unit 4 and the multivalued calculating unit 8.

The following discusses the synchronization-detecting unit 7.

The synchronization-detecting unit 7 detects the calculation start timing from the intermediate bitstreams fed out of the storage unit 6. More specifically, the synchronization-detecting unit 7 detects the inserted synchronous words from the intermediate bitstreams. The detection of the synchronous words is recognized as the calculation start timing. The synchronization-detecting unit 7 feeds information on the detected calculation start timing into the multivalued calculating unit 8. The calculation start timing is used to accurately understand the time when the multivalued calculation is started in the multivalued calculating unit 8.

The following discusses the multivalued calculating unit 8.

The multivalued calculating unit 8 sets up the calculating start timing as the time when the multivalued calculation is started, and performs the multivalued calculation of the intermediate bitstreams or binary signals.

The intermediate bitstreams treated by the multivalued calculating unit 8 have already been arithmetically decoded by the arithmetic decoding-calculating unit 4 in accordance with the probability. Accordingly, the intermediate bitstreams need not be subjected to the multivalued calculation in accordance with the probability renewed per one-bit. Consequently, there is no need for the multivalued calculating unit 8 to practice the multivalued calculation of the intermediate bitstreams serially per one-bit. For example, the multivalued calculation may be practiced for each certain amount such as 8-bit and 16-bit.

The intermediate bitstreams are stored in certain amounts in the storage unit 6, and the multivalued calculating unit 8 can take out from the storage unit 6, the entire data required for each calculation. For example, assuming that the multivalued calculating unit 8 is operable to perform the calculation per unit such as 8-bit and 16-bit, the multivalued calculating unit 8 takes out the data from the storage unit 6 for each 8-bit or otherwise each 16-bit in each one-cycle, thereby practicing the multivalued calculation.

The intermediate bitstreams have the synchronous words or others inserted therein by the stream-converting unit 5. The detecting of the synchronous words allows the synchronization-detecting unit 7 to grasp the calculation start timing of the multivalued calculation made by the multivalued calculating unit 8. The multivalued calculating unit 8 can practice the multivalued calculation in accordance with the calculation start timing, and therefore can accomplish the calculation without erroneously recognizing the start and end of encoded data contained in each of the intermediate bitstreams. As a result, images reproduced based on the data having experienced the multivalued calculation are free of image deletions and disturbances.

More specifically, the incoming bitstreams are initially arithmetically decoded serially per one-bit in one-cycle in accordance with the probability, and the synchronous words are thereafter inserted into the decoded data thus decoded, thereby generating the intermediate bitstreams. The intermediate bitstreams are stored in the storage unit 6 until the data is accumulated in certain amounts in the storage unit 6. After the accumulation of the certain amount of the data, the intermediate bitstreams stored in the storage unit 6 are subjected to the multivalued calculation in response to the calculation start timing. The intermediate bitstreams are treated in parallel for each multi-bit in one-cycle during the multivalued calculation.

As a result of the above flow of processing, a processed data amount per unit time in the multivalued calculating unit 8 is greater than that in the arithmetic decoding-calculating unit 4. A difference in processing amount therebetween is absorbed by the temporary storage of the intermediate bitstreams in the storage unit 6.

As a result, the multivalued calculating unit 8 is constructed by clock speeds that are free to design the decoding-processing apparatus, regardless of the handled bit amounts. For example, an HD-TV image is processed by the multivalued calculating unit 8 at the clock frequency of some 49 MHz when the multivalued calculating unit 8 is operable to process the data per 16-bit in one-cycle. Of course, the occurrence of errors due to an overflow of data is prevented. The synchronously processed intermediate bitstreams allow the multivalued calculating unit 8 to positively grasp a starting position of the encoded data contained in each of the intermediate bitstreams, and consequently reproduced images are precluded from being adversely affected.

Figure 2:
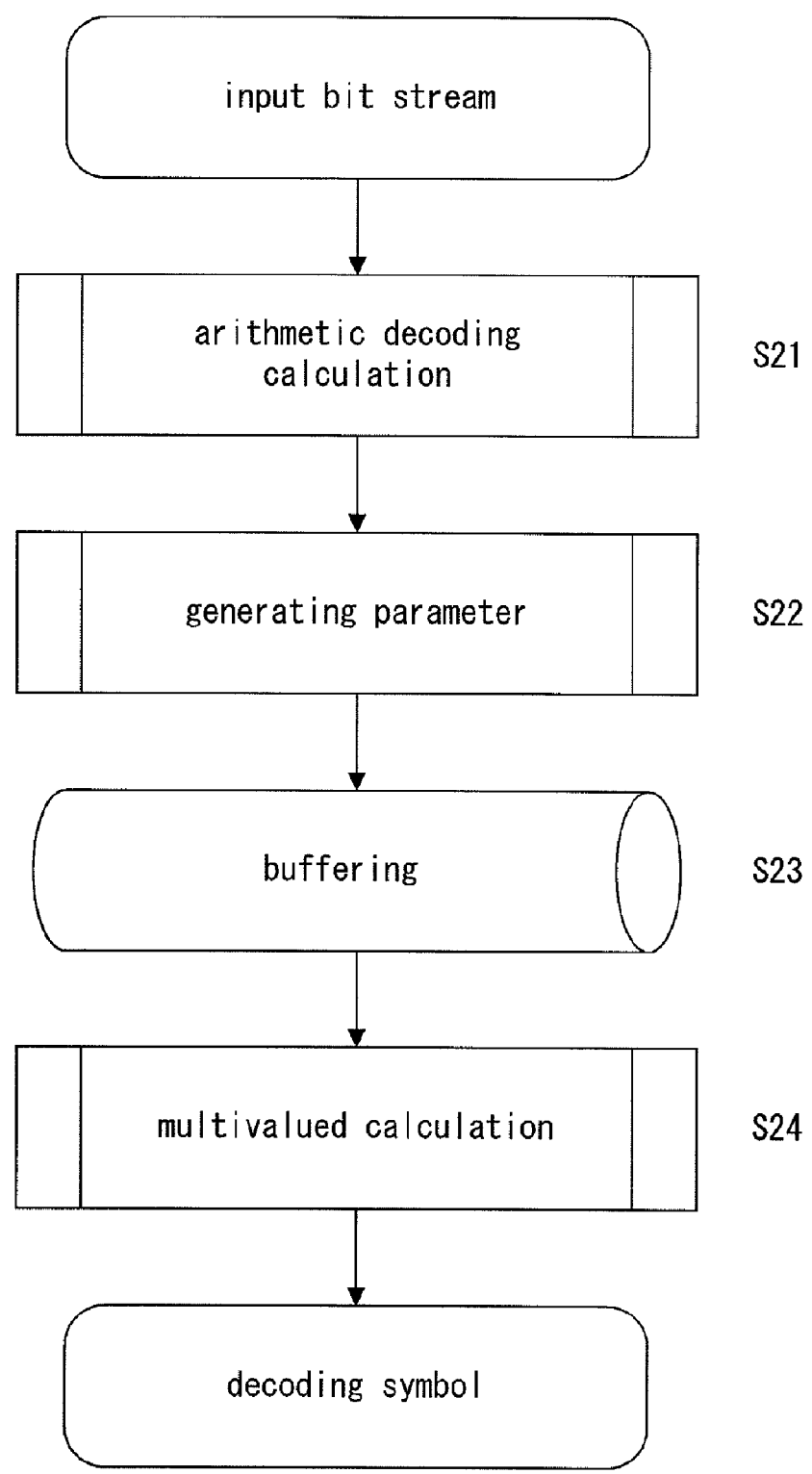
FIG. 2 is a flowchart illustrating a course of action made by the decoding-processing apparatus according to the first embodiment.
Figure 3:
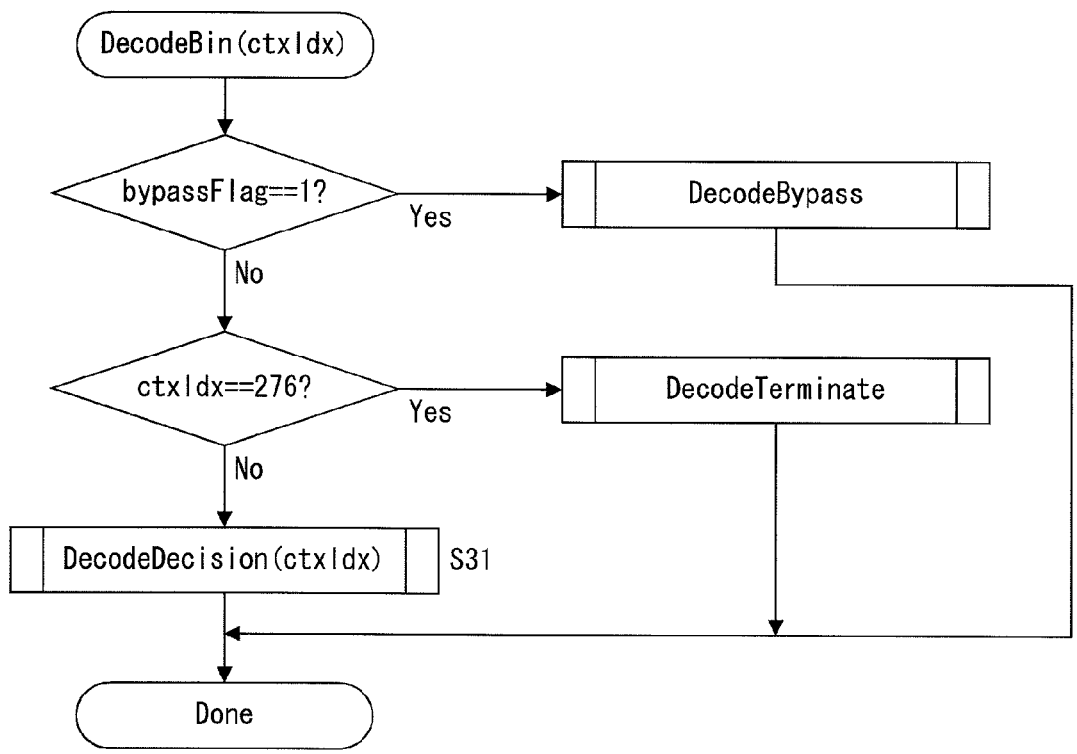
FIG. 3 is a flowchart illustrating a course of action made by the decoding-processing apparatus according to the first embodiment.
Figure 4:
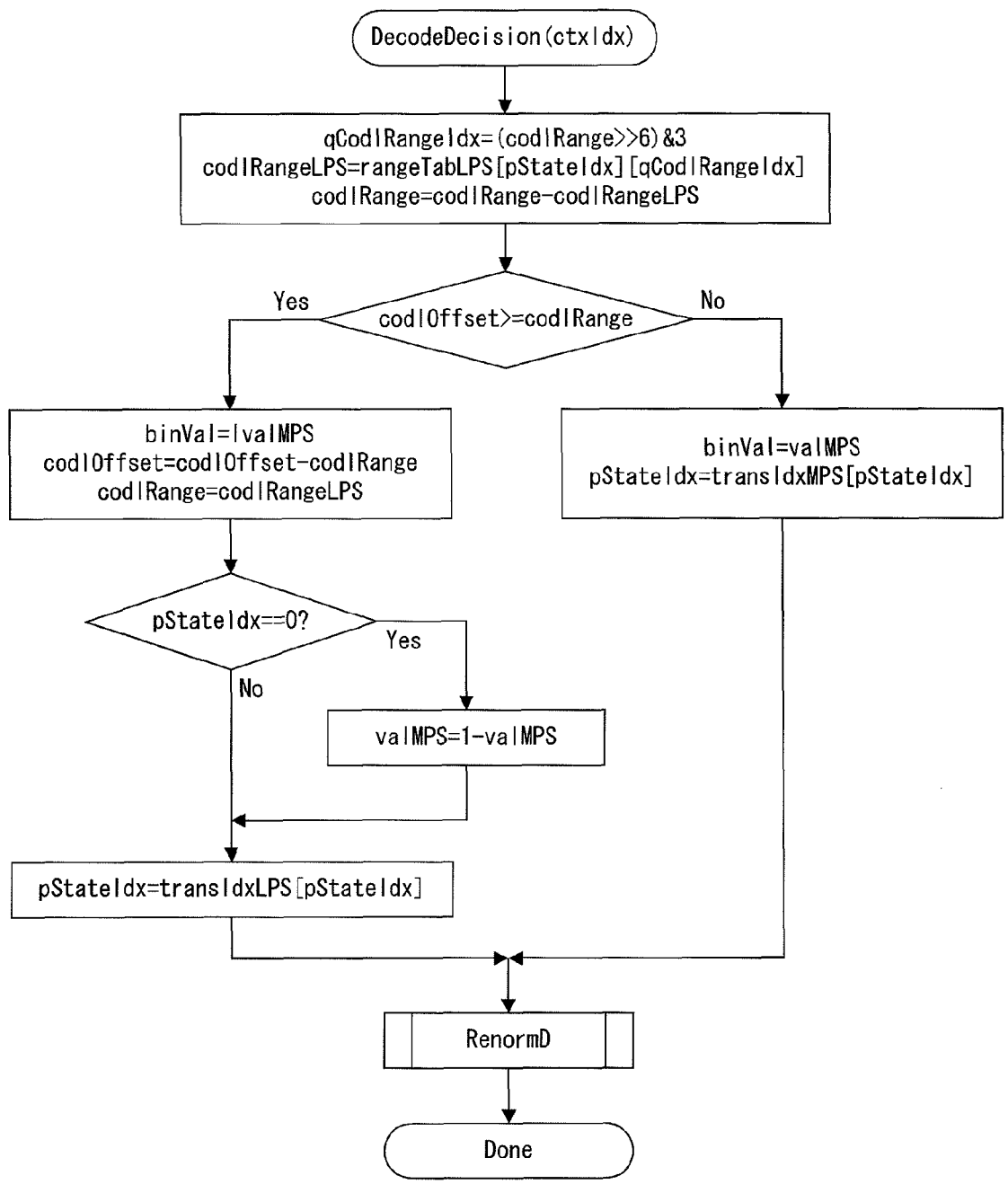
FIG. 4 is a flowchart illustrating a course of action made by the decoding-processing apparatus according to the first embodiment.

The following discusses a course of action made by the decoding-processing apparatus 1 with reference to FIGS. 2, 3, and 4.

FIG. 2 is a flowchart illustrating a course of action made by the decoding-processing apparatus according to the present embodiment.

The bitstreams enter the decoding-processing apparatus 1. At step S21, the arithmetic decoding calculation is performed. At step S22, the parameters are generated. At step S23, the data arithmetically decoded and then turned to the intermediate bitstreams are buffered. At step S24, the buffered intermediate bitstreams experiences the multivalued calculation. The data subjected to the multivalued calculation are ultimately symbol-decoded.

FIGS. 3 and 4 are flowcharts illustrating a course of action made by the decoding-processing apparatus according to the present embodiment.

The flowcharts as illustrated in FIGS. 3 and 4 illustrate a course of action made by arithmetic decoding as defined by "Draft Errata List with Revision-Marked Correction for H.264/AVC" at "9.3 CABAC parsing process for slice data".

The flowchart of FIG. 3 illustrates details of step S21 of FIG. 2. The flowchart of FIG. 4 illustrates details of step S31 of FIG. 3.

Figures 5, 6:
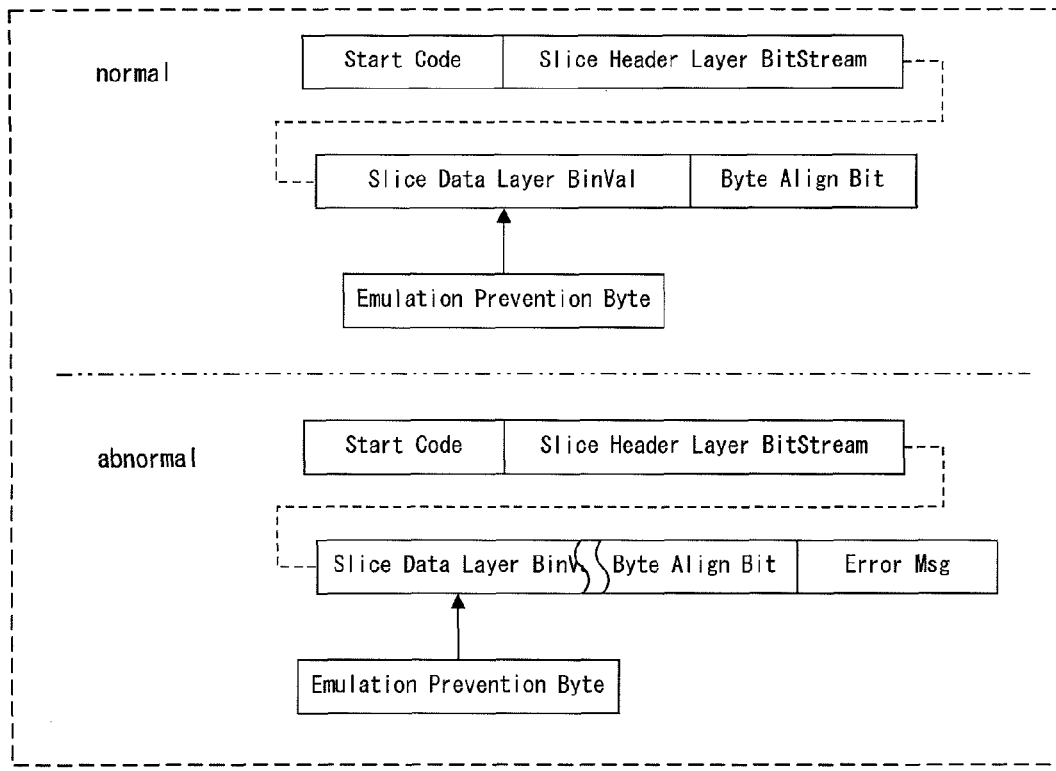
FIG. 5 is an illustration showing a list of binarized processing algorithm as specified by H.264.
FIG. 6 is a structured diagram illustrating intermediate bitstreams according to a second embodiment.

The following discusses, with reference to FIG. 5, binarized calculation paired with the multivalued calculation made by the decoding-processing apparatus 1.

FIG. 5 is an illustration showing a list of binarized processing algorithm as specified by H.264. In decoding-processing apparatuses that conform to the H.264 standard, any one of forms of binarized calculation as illustrated in FIG. 5 or otherwise multivalued calculation is used.

For example, according to the "Fixed Length" method, fixed length coding determines a code length. According to the "Unary" method, the value of "1" is arrayed in succession for a period of a symbol, but the end of the array is terminated by the value of "0", thereby showing the end of the symbol.

According to the "Truncated Unary" method, for a symbol having the greatest bit length in the standard, the value of "0" added to the end of the array is omitted. The "Look-up Table" method is also used as another method.

The decoding-processing apparatus constructed as described above provides high-speed multivalued calculation of the bitstreams, and eliminates the need for high clock frequencies such as to make it difficult to design the decoding-processing apparatus. In addition, the storage unit 6 may be such as to absorb a difference in processing speed between the arithmetic decoding calculation accompanied by processing per one-bit, and the multivalued calculation that allows for multi-bit processing, and consequently the storage unit 6 need not have large capacity.

Although the present embodiment describes the decoding-processing apparatus 1, the present embodiment is also applicable to encoding-processing apparatuses constructed to process the data inversely to the decoding-processing apparatus 1.

It is also desirable that the decoding-processing apparatus 1 decodes bitstreams that have been arithmetically encoded using several blocks formed in each image. The decoding is practiced in accordance with courses of processing as given below.

At an initial step, for incoming bitstreams arithmetically encoded for each of specified blocks that are formed in each image, the context-calculating unit 2 calculates the probability of symbols in accordance with information on neighboring blocks around each target block to be processed.

At a subsequent step, the arithmetic decoding-calculating unit 4 decodes the incoming bitstreams in accordance with information on the probability from the context-calculating unit 2, thereby providing decoded data.

The parameter-generating unit 3 generates, on the basis of the decoded data, parameters to be used by the context-calculating unit 2. The stream-converting unit 5 inserts synchronous words and error identifiers into the decoded data before converting the decoded data into intermediate bitstreams. The intermediate bitstreams are stored in the storage unit 6.

The synchronization-detecting unit 7 detects the synchronous words from the intermediate bitstreams read out of the storage unit 6, thereby detecting calculating start timing. The multivalued calculating unit 8 practices the multivalued calculation of the intermediate bitstreams. At this time, differently from the incoming bitstreams, the arithmetic decoding of the intermediate bitstreams on the basis of the information on the neighboring blocks has been terminated. Consequently, the multivalued calculating unit 8 can practice the multivalued calculation of the intermediate bitstreams without the need for the information on the neighboring blocks. As a result, the multivalued calculation is achievable at improved processing speed. The processing as just discussed previously is realized by any decoding-processing apparatus constructed as illustrated in FIG. 1.

The above processing achieves high-speed multivalued calculation without the need for the information on the neighboring blocks in the multivalued calculation, even with bitstreams based on the information on the neighboring blocks around each target block to be encoded in the encoding of the blocks formed in each image.

Second Embodiment

A second embodiment is now described. In the present embodiment, variations in behavior of a stream-converting unit 5 are described.

The stream-converting unit 5 converts, back into the form of bitstreams, decoded data as decoded by an arithmetic decoding-calculating unit 4, thereby providing intermediate bitstreams.

The stream-converting unit 5 performs the byte alignment processing of the intermediate bitstreams because each synchronous word must be detected from a byte alignment position. More specifically, a bit length is rendered equal to a multiple of a byte.

At this time, the stream-converting unit 5 inserts the synchronous words into the decoded data, thereby generating the intermediate bitstreams. According to the H.264 standard, three different bit strings of "000001", "000002", and "000003" are defined as particular data arrays. In order to perform proper multivalued calculation in the multivalued calculating unit 8, the stream-converting unit 5 generates the intermediate bitstreams in accordance with the above particular bit strings.

The bit string "000001" is defined as a synchronous word, and the stream-converting unit 5 inserts the bit string "000001" by way of the synchronous word into the decoded data at a predetermined position thereof.

The bit string "000002" is an error identifier showing that the bitstreams contain non-multivaluable data. For example, when the decoded data, as decoded by the arithmetic decoding calculating unit 4, contains data incapable of experiencing the multivalued calculation, then the stream-converting unit 5 inserts the bit string "000002" by way of the error identifier into the decoded data. The multivalued calculating unit 8 skips the multivalued calculation when the intermediate bitstreams received from the storage unit 6 contain the error identifier.

The stream-converting unit 5 inserts the error identifier into the decoded data when the intermediate bitstreams cannot be properly multivalued, and when the synchronous words in the intermediate bitstreams are erroneously detected during the multivalued calculation, or otherwise when any code other than bit strings specified as the synchronous words is detected from the intermediate bitstreams at a position of any one of the synchronous words in the intermediate bitstreams.

The bit string "000003" is used as an emulation prevention byte. The bit string "000003" or emulation prevention byte is inserted to distinguish the synchronous words from non-synchronous words.

FIG. 6 is a structured diagram illustrating intermediate bitstreams according to the present embodiment. Differently from a normal system-related intermediate bitstream, an abnormal system-related intermediate bitstream has an error message inserted therein. The error message is the bit string "000002", i.e., an error identifier.

In order to treat multi-bit in parallel at a time, the multivalued calculating unit 8 desirably calculates the data in byte unit in light of easy calculation processing. Accordingly, each of the intermediate bitstreams preferably has a bit length equal to a multiple of a byte. Consequently, as illustrated in FIG. 6, "Byte Align Bit" is inserted in each of the intermediate bitstreams to adjust the bit length of each of the intermediate bitstreams in such a manner that the aforesaid bit length is equal to a multiple of a byte.

The bit length of each of the intermediate bitstreams may be equal to a multiple of a unit of a calculation amount made by the multivalued calculating unit 8. When the unit of the calculation amount made by the multivalued calculating unit 8 is a byte, then each of the intermediate bitstreams has a bit length adjusted to be equal to a multiple of a byte. When the unit of the calculation amount made by the multivalued calculating unit 8 is two bytes, then each of the intermediate bitstreams has a bit length adjusted to be equal to a multiple of two bytes.

Figure 7:
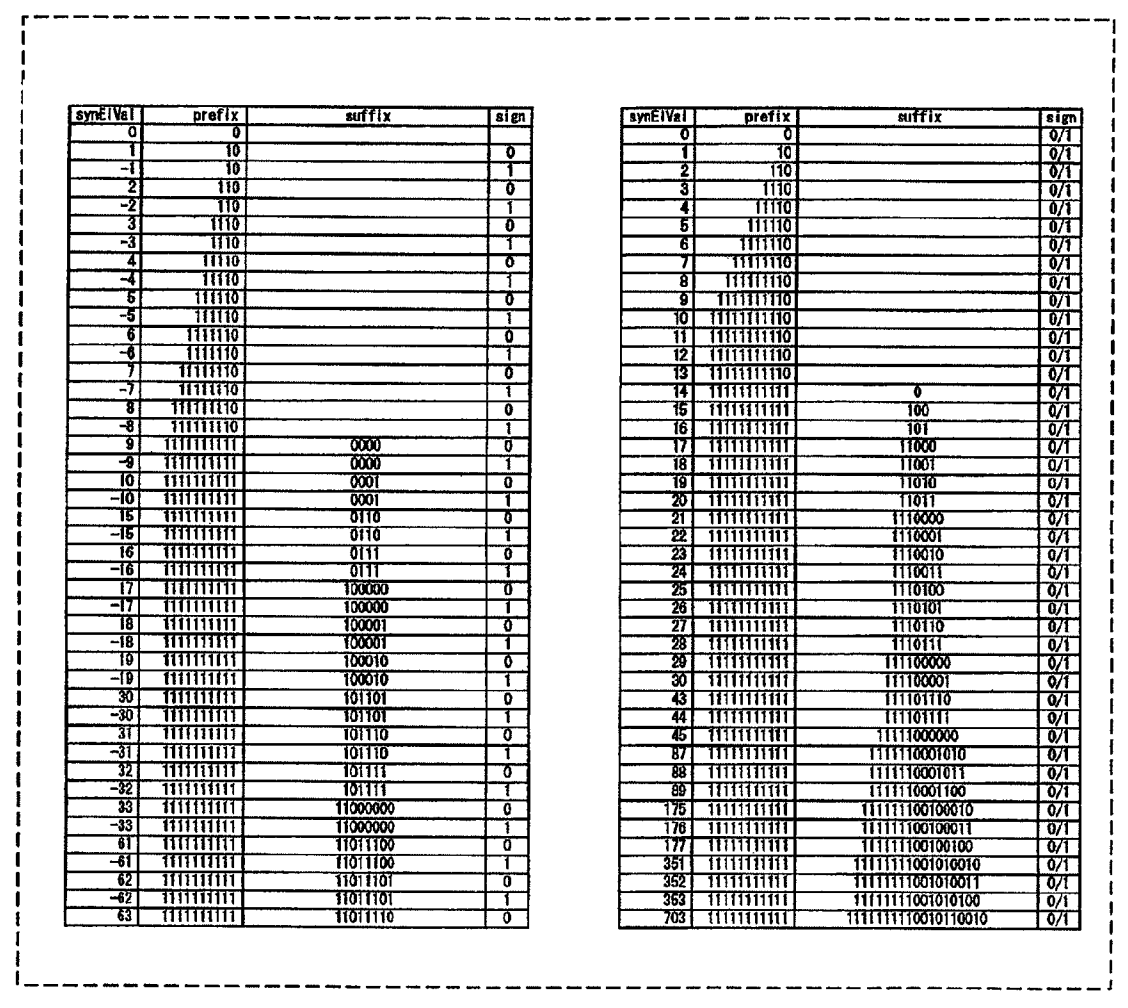

The stream-converting unit 5 generates the intermediate bitstreams based on the decoded data in such a manner as to provide a shortened bit length for each syntax element. In usual arithmetic encoding, encoding a syntax element provides a bit length having a predetermined length. At this time, in usual arithmetic encoding, a bit length for each of the syntax elements is increased in length in accordance with the standard. More specifically, as illustrated in FIG. 7 and the left half of FIG. 8, any one of the syntax elements contained in the incoming bitstreams has an encoded bit length rendered greater in length. The arithmetic encoding provides a bit length increased in length in light of the processing in context calculation.

However, the multivalued calculating unit 8 is free of the need for context calculation-based processing, and each bitstream having a bit length equal to that of the usual arithmetic encoding is unnecessary. As a result, as illustrated in the right half of FIG. 8, bit strings showing the same syntax element may be made shorter in length than bit strings encoded in accordance with the usual arithmetic encoding.

As just discussed, for the bit strings showing the same syntax element, the stream-converting unit 5 generates the intermediate bitstreams using shorter bit strings as illustrated in the right half of FIG. 8. FIG. 8 is an illustration showing an encoding list of the syntax elements according to the present embodiment.

A bit length of each of the intermediate bitstreams for each of the syntax elements contained in the generated intermediate bitstreams is smaller in length than a bit length of each of the incoming bitstreams for each of the syntax elements contained in the incoming bitstreams, and consequently the multivalued calculation is executed with lighter loads in the multivalued calculating unit 8.

It is also preferred that the bit lengths of the intermediate bitstreams over several syntax elements are reduced in length to provide shortened bit lengths of the intermediate bitstreams.

Figure 9:
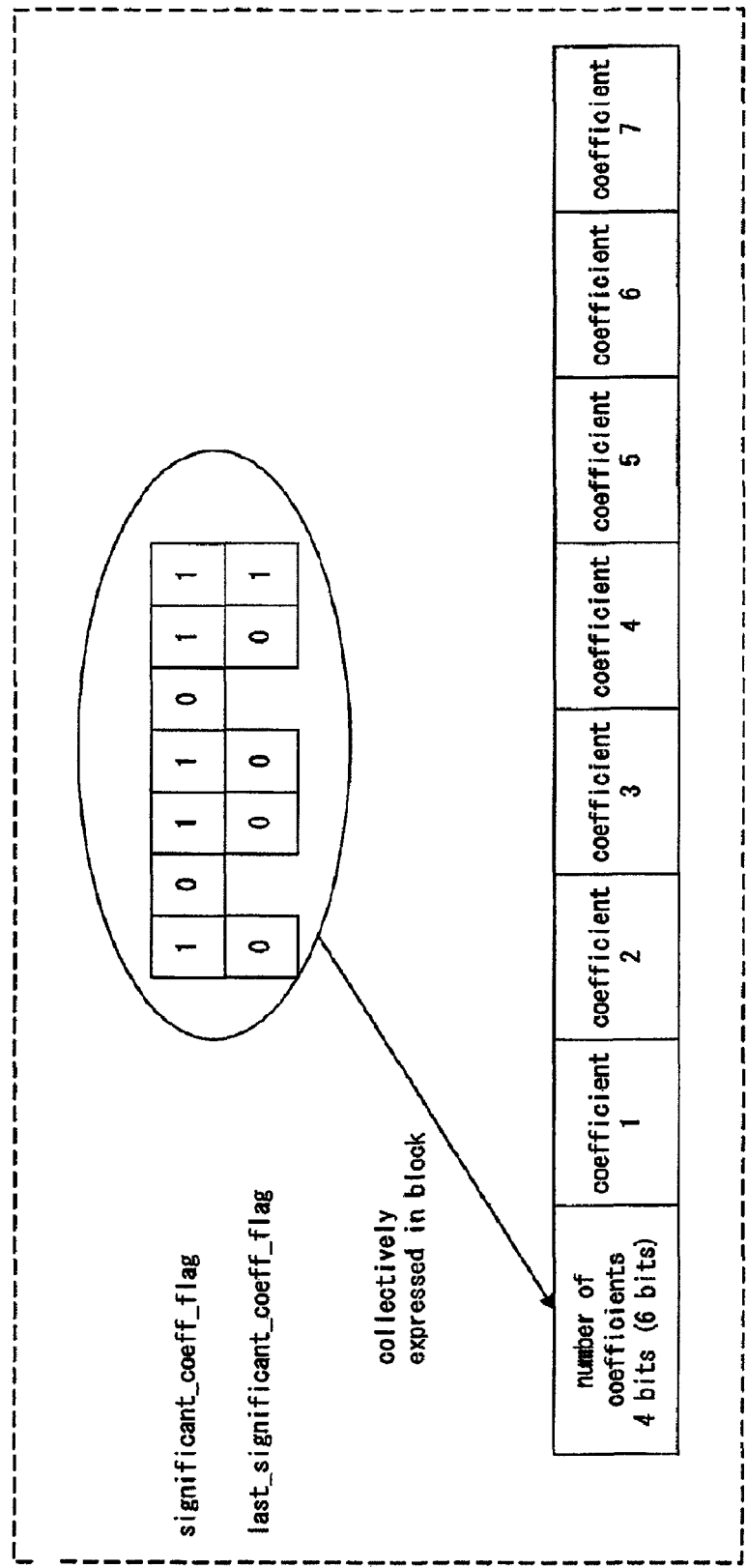
FIG. 9 is a structured diagram illustrating an intermediate bitstream according to the second embodiment.

FIG. 9 is a structured diagram illustrating an intermediate bitstream according to the present embodiment.

When the intermediate bitstream contains "coeff_abs_level_minus1" or one of the syntax elements, then the number of coefficients is shown by syntax elements "significant_coeff_flag" and "last_significant_coeff_flag". At this time, as illustrated in FIG. 9, a block of the intermediate bitstream at the head thereof shows the number of coefficients in advance, and consequently the multivalued calculation is completed in less processing time.

It is further preferred that, when any block in an image is a target to be subjected to the multivalued calculation, the stream-converting unit 5 generates intermediate bitstreams without the need for data on neighboring blocks around the target block.

Figure 10:
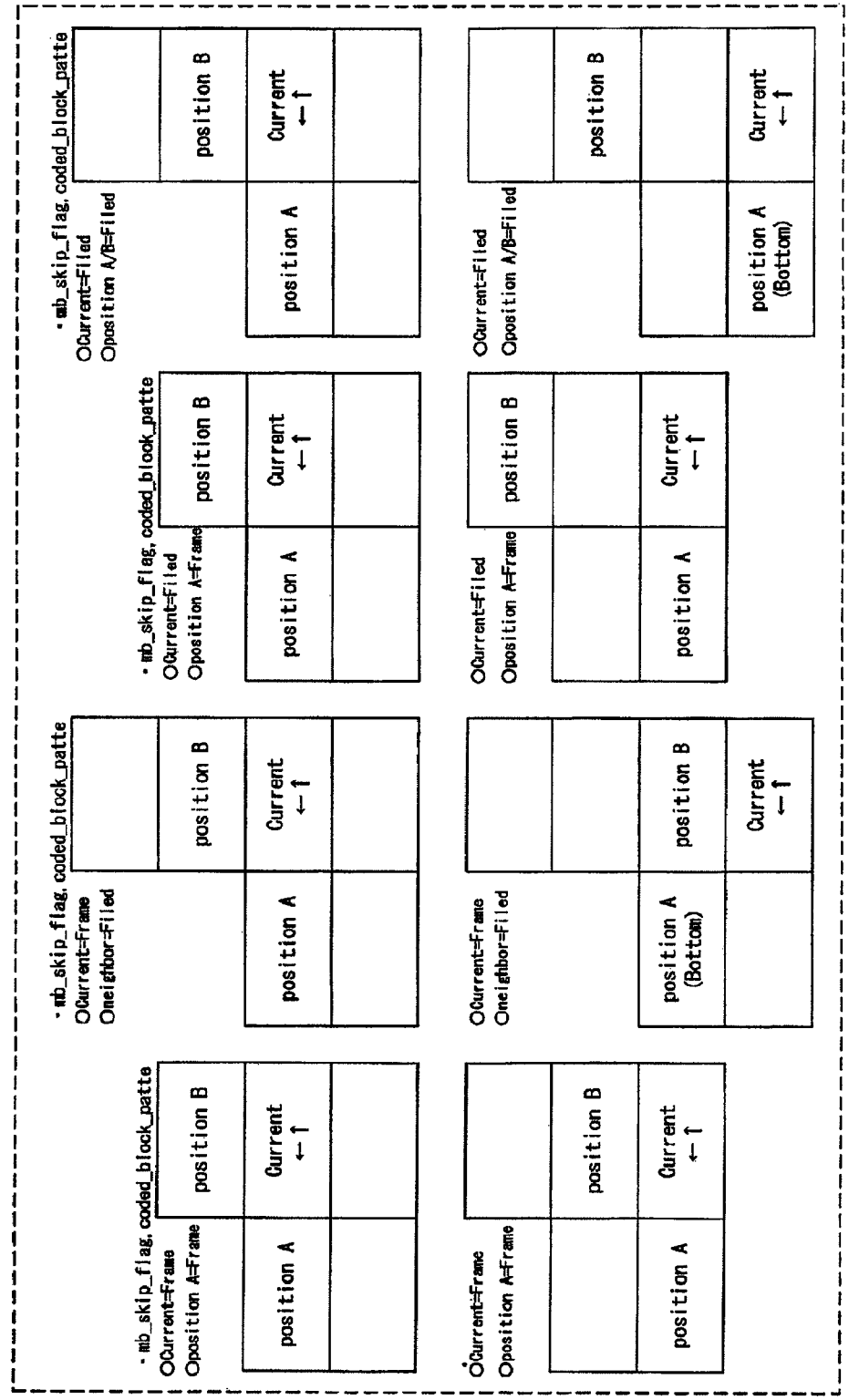
FIG. 10 is an illustration showing decoding processing according to the second embodiment.

FIG. 10 is an illustration showing the decoding processing according to the present embodiment.

As illustrated in FIG. 10, to perforin the multivalued calculation of a block, neighboring blocks around the block are referenced. Accordingly, the multivalued calculation must be made with reference to all of the target block and neighboring blocks. This causes a problem of increased time required for the multivalued calculation.

In the decoding-processing apparatus 1 according to the present embodiment, the arithmetic decoding calculating unit 4 allows for the processing with reference to the neighboring blocks, and the multivalued calculating unit 8 needs not reference the neighboring blocks. As a result, the stream-converting unit 5 generates the intermediate bitstreams on the premise that the neighboring blocks need not be referenced.

As illustrated in FIG. 10, for blocks in each image used by the multivalued calculating unit 8, there is no need for information on the neighboring blocks. Accordingly, calculation based on the neighboring blocks as well as the target block is eliminated, thereby providing high-speed multivalued calculation.

When the incoming bitstreams are non-compressed codes, the stream-converting unit 5 outputs the incoming bitstreams directly as intermediate bitstreams.

At this time, a header-analyzing unit 11 detects that the incoming bitstreams are non-compressed codes, and the arithmetic decoding-calculating unit 4 skips the arithmetic decoding calculation of the incoming bitstreams in response to the result from the detection. The unprocessed incoming bitstreams in which the arithmetic decoding calculation has been skipped are outputted directly as the intermediate bitstreams by the stream-converting unit 5. As a result, undue loads on the calculation are decreased.

Third Embodiment

A third embodiment is now described. A decoding-processing apparatus according to the present embodiment is operable to determine whether incoming bitstreams have been arithmetically encoded or otherwise whether they have been entropy-encoded, thereby decoding the incoming bitstreams in accordance with results from the determination.

Figure 11:
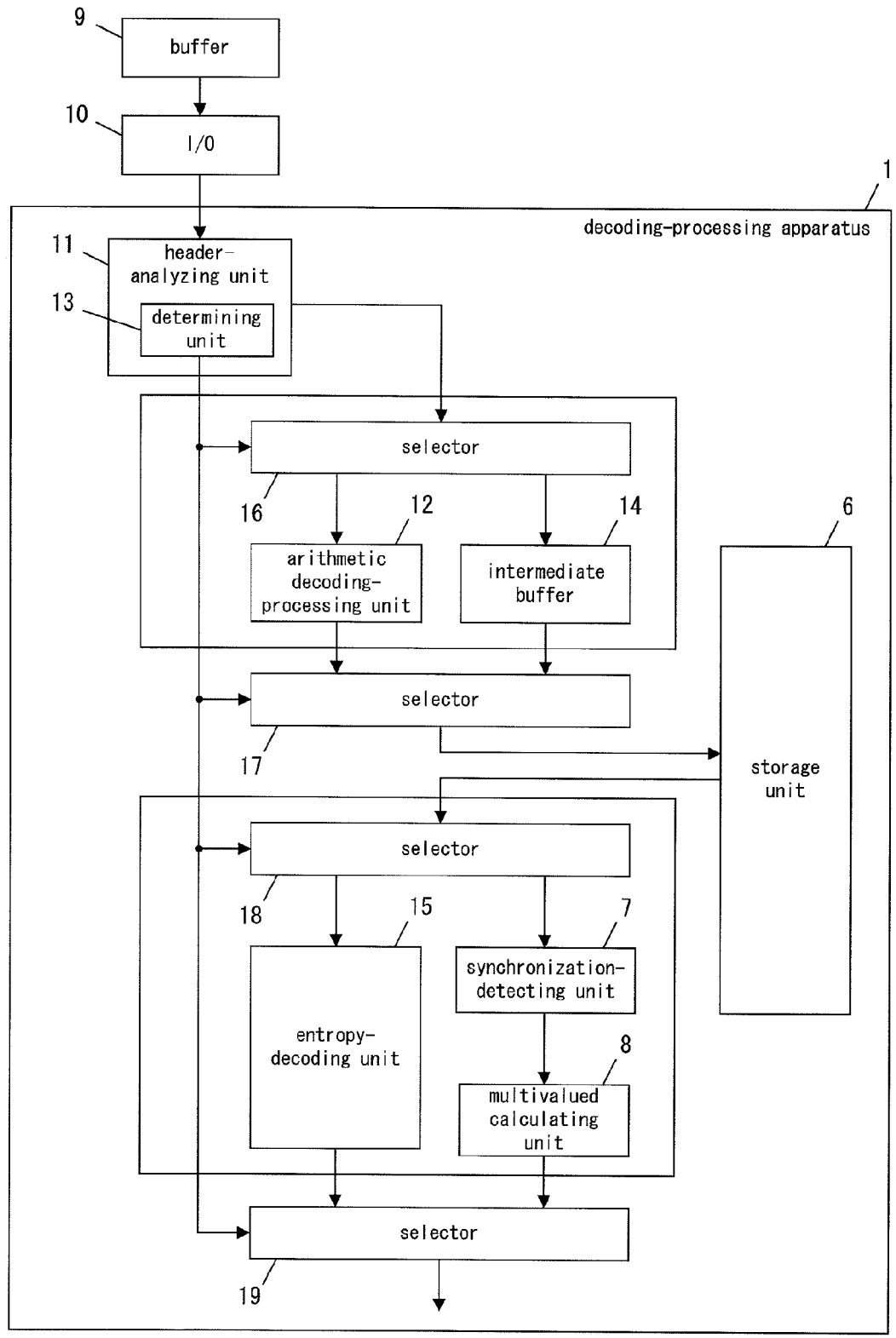
FIG. 11 is a block diagram illustrating a decoding-processing apparatus according to a third embodiment.

FIG. 11 is a block diagram illustrating the decoding-processing apparatus according to the present embodiment.

The decoding-processing apparatus 1 comprises a multivalued calculating unit 8 for arithmetic calculation decoding, and an entropy-decoding unit 15 for entropy decoding. The multivalued calculating unit 8 and the entropy-decoding unit 15 are arranged in parallel with one another.

A header-analyzing unit 11 includes a determining unit 13. The determining unit 13 determines, based on an analysis of a header of each of the incoming bitstreams, whether the incoming bitstreams have been arithmetically encoded or otherwise whether they have been entropy-encoded. The determining unit 13 feeds results from the determination into selectors 16, 17, 18, and 19. The selectors 16 to 19 determine a course of processing in response to each of the results from the determination.

An arithmetic decoding-processing unit 12 is the same as that of FIG. 1, and includes an arithmetic decoding-calculating unit 4, a context-calculating unit 2, a parameter-generation unit 3, and a stream-converting unit 5.

The entropy-decoding unit 15 is operable to decode bitstreams encoded in accordance with the entropy encoding. For example, the entropy-decoding unit 15 includes a CAVLD operable to decode bitstreams that have been encoded in accordance with a CAVLC as defined by the H.264 standard.

A synchronization-detecting unit 7 and a multivalued calculating unit 8 are the same as those of FIG. 1.

The following discusses a course of action made by the decoding-processing apparatus 1.

The determining unit 13 instructs the selectors 16 to 19 to form an arithmetic decoding-based course of processing when determining that the incoming bitstreams have been encoded in accordance with the arithmetic-encoding system. Initially, the incoming bitstreams are transferred to the arithmetic decoding-processing unit 12 after being analyzed by the header-analyzing unit 11. The arithmetic decoding-processing unit 12 generates intermediate bitstreams, and then transfers the generated intermediate bitstreams to the storage unit 6. The intermediate bitstreams taken out of the storage unit 6 are delivered through the synchronization-detecting unit 7 to the multivalued calculating unit 8, in which the intermediate bitstreams are multivalued. Ultimately, the selector 19 selects the output from the multivalued calculating unit 8, and the multivalued decoded data is transferred to an image decoder (not shown).

When determining that the incoming bitstreams have been encoded in accordance with the entropy-encoding system, then the determining unit 13 instructs the selectors 16 to 19 to form an entropy decoding-based course of processing.

The header analysis is also performed by the entropy-decoding unit 15 to determine whether the intermediate bitstreams generated by the arithmetic decoding-processing unit 12 are in accordance with the entropy encoding.

Initially, the incoming bitstreams are transferred to the storage unit 6 through an intermediate buffer 14 after being analyzed by the header-analyzing unit 11. The intermediate bitstreams are neither calculated nor processed at all until reaching the storage unit 6. The intermediate bitstreams taken out of the storage-unit 6 are transferred to the entropy-decoding unit 15 in response to a selection made by the selector 18. The entropy-decoding unit 15 decodes the incoming bitstreams in accordance with decoding processing corresponding to the entropy-encoding system. For example, variable length decoding including Huffman decoding is executed. In addition, decoding processing according to the CAVLD system as specified by the H.264 is practiced.

Figure 12:
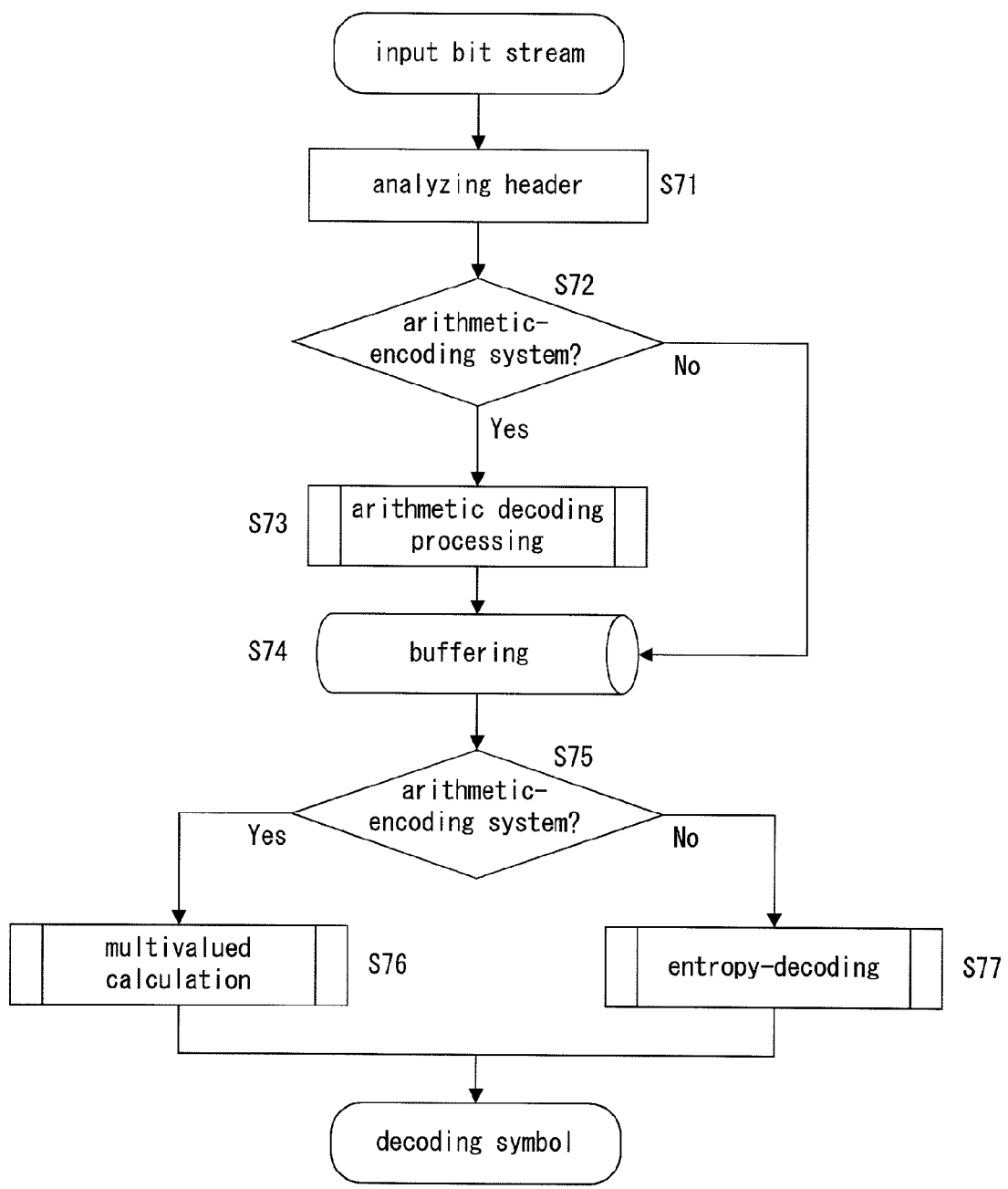
FIG. 12 is a flowchart illustrating a course of action made by the decoding-processing apparatus according to the third embodiment.

The following discusses a flow of action with reference to the flowchart of FIG. 12. FIG. 12 is a flowchart illustrating a course of action made by the decoding-processing apparatus according to the present embodiment.

Initially, the bitstreams enter the decoding-processing apparatus 1. At step S71, the header of each of the incoming bitstreams is analyzed. At step S72, an encoding system applied to the incoming bitstreams is determined on the basis of the header analysis.

When the determination in step S72 results in the arithmetic-encoding system, then, at step S73, the incoming bitstreams are subjected to arithmetic decoding processing. Subsequently, at step S74, the intermediate bitstreams are buffered in the storage unit 6.

When the determination in step S72 results in the entropy-encoding system, then, at step S74, the incoming bitstreams are directly buffered.

At step S75, it is determined whether or not the arithmetic-encoding system is utilized. When step S75 determines that the arithmetic-encoding system is utilized, then at step S76 after the buffering, the intermediate bitstreams as encoded in accordance with the arithmetic-encoding system are multivalued. Meanwhile, when step S75 determines that the arithmetic-encoding system is not utilized, then at step S77, the incoming bitstreams as encoded in accordance with the entropy-encoding system are entropy-decoded.

As discussed above, the decoding-processing apparatus 1 are provided with the arithmetic- and entropy-decoding functions, and provides proper decoding processing in accordance with each of the encoding systems in response to results from a determination made by the determining unit 13. More specifically, the decoding-processing apparatus 1 according to the present embodiment allows for decoding processing responsive to variations of the encoding in the H.264 standard.

Although the present embodiment discusses the construction including both of the arithmetic decoding and the entropy decoding, other decoding processing functions may be included when necessary.

Fourth Embodiment

A fourth embodiment is now described. The present embodiment describes an encoding-processing apparatus.

Figure 13:
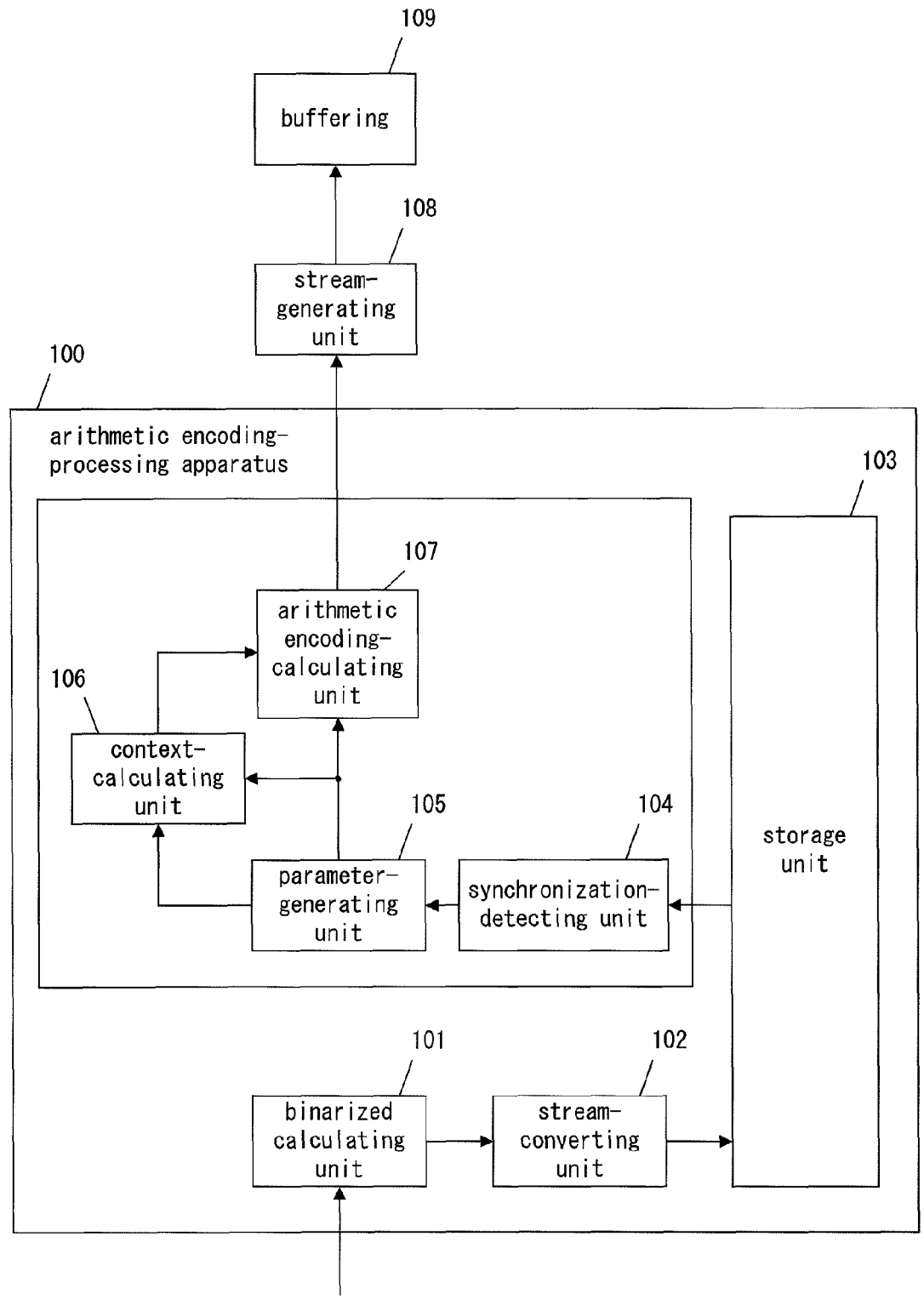
FIG. 13 is a block diagram illustrating an arithmetic encoding-processing apparatus according to a fourth embodiment.

FIG. 13 is a block diagram illustrating an arithmetic encoding-processing apparatus according to the present embodiment.

The arithmetic encoding-processing apparatus 100 comprises elements paired with those of the arithmetic-decoding apparatus 1 of FIG. 1.

A binarized calculating unit 101 is operable to convert compressed and encoded data into binaries. A stream-converting unit 102 is operable to insert synchronous words and identifiers into the data that has been converted into the binaries, thereby generating bitstreams. The generated bitstreams are stored in a storage unit 103.

A synchronization-detecting unit 104 is operable to detect the synchronous words from the bitstreams stored in the storage unit 103. The synchronization-detecting unit 104 is further operable to eliminate emulation prevention bytes and other reserved words from the bitstreams. The bitstreams thus processed are used by a parameter-generating unit 105 to exact parameters for use in the calculation of the probability.

A context-calculating unit 106 is operable to calculate the probability in accordance with the generated parameters from the parameter-generating unit 105. An arithmetic encoding-calculating unit 107 is operable to arithmetically encode the synchronously detected data in accordance with the probability.

In a stream-generating unit 108, as a result of the processing executed by the arithmetic encoding-calculating unit 107, the data encoded in accordance with the arithmetic-encoding system are converted into arithmetic encoding-based bitstreams. The stream-generating unit 108 transfers the bitstreams through a buffer 109 to a decoding apparatus (not shown).

The stream-converting unit 102 inserts emulation prevention bytes and error identifiers into the bitstreams when necessary. In addition, the stream-converting unit 102 adjusts a bit length of each of the bitstreams in such a manner that the bit length is equal to a multiple a unit of the processing amount for multivalued processing in the decoding.

Similarly, the stream-generating unit 108 operable to change the arithmetically encoded data to the bitstreams executes the processing in a manner similar to the stream-converting unit 102. More specifically, the stream-generating unit 108 inserts synchronous words, the emulation prevention bytes, and the error identifiers into the bitstreams; and the stream-generating unit 108 adjusts a bit length of each of the bitstreams in such a manner that the bit length is equal to a multiple of the unit of processing amount for multivalued processing in the decoding.

The arithmetic encoding-calculating unit 107 preferably uses CABAC encoding as specified by the H.264.

The construction as described above is applied to the encoding-processing apparatus as well, thereby absorbing a difference in processing speed between the binarized calculation operable to treat multi-bit at a time, and the arithmetic encoding designed for processing per one-bit. The binarized calculation is made at high speed without the arithmetic encoding being adversely affected, while the arithmetic encoding is executed per one-bit. As a result, high-speed clock signals need not be imparted to the processing of either the binarized calculation or the arithmetic encoding, with a consequential decrease in constraint on design of the encoding-processing apparatus.

The present invention achieves the arithmetic decoding calculation and multivalued calculation based on clock speeds that are free to make it easy to design the decoding-processing apparatus, while displaying images in real time.

The present invention divides the processing between the arithmetic decoding operable to treat only per one-bit, and the multivalued calculation operable to treat per multi-bit, and connects the former to the latter processing through buffering, thereby absorbing a difference in processing speed therebetween.

The present invention converts the decoded data as arithmetically decoded, into the pseudo bitstreams before making the multivalued calculation thereof and consequently eliminates the occurrence of errors in synchronization during the multivalued calculation. As a result, reproduced images are displayed without errors. The multivalued calculation is, of course, made at high speeds according to clock speeds that make it easy to design the decoding-processing apparatus, thereby eliminating the occurrence of data deletions due to an overflow of data.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

The present invention finds desirable applications in the field of the decoding of bitstreams encoded in accordance with an arithmetic-encoding system, e.g., in H.264 and other image compression/expansion.

The invention claimed is:

1. An encoding device for performing a Context-based Adaptive Binary Arithmetic Coding (CABAC) encoding process, the encoding device comprising:
   a binarization unit performing a first half of the CABAC encoding process by binarizing multivalued syntax elements to generate binary signals;
   a converting unit inserting a synchronous word indicating a starting position of an arithmetic-encoding operation into the generated binary signals to generate an intermediate bitstream, and storing the intermediate bitstream on an intermediate buffer;
   a detecting unit detecting the starting position of the arithmetic-encoding operation by detecting the synchronous word from the intermediate bitstream read from the intermediate buffer; and
   an arithmetic-encoding unit performing a second half of the CABAC encoding process by arithmetic-encoding the intermediate bitstream read from the intermediate buffer in accordance with the starting position detected by the detecting unit,
   wherein the generated binary signals are binary representations of values of the multivalued syntax elements, and are intermediate data of the CABAC encoding process.

2. An encoding method for performing a Context-based Adaptive Binary Arithmetic Coding (CABAC) encoding process, the encoding method comprising:
   performing a first half of the CABAC encoding process by binarizing multivalued syntax elements to generate binary signals and storing the generated binary signals;
   inserting a synchronous word indicating a starting position of an arithmetic-encoding operation into the generated binary signals to generate an intermediate bitstream, and storing the intermediate bitstream on an intermediate buffer;
   detecting the starting position of the arithmetic-encoding operation by detecting the synchronous word from the intermediate bitstream read from the intermediate buffer; and
   performing a second half of the CABAC encoding process by arithmetic-encoding the intermediate bitstream read from the intermediate buffer in accordance with the starting position detected by the detecting,
   wherein the generated binary signals are binary representations of values of the multivalued syntax elements, and are intermediate data of the CABAC encoding process.

* * * * *